US012652754B2

(12) United States Patent
Lim et al.

(10) Patent No.: US 12,652,754 B2
(45) Date of Patent: Jun. 9, 2026

(54) METHOD AND STRUCTURE FOR ALIGNMENT OF LENS TO OPTICAL PRODUCT AT PCBA LEVEL

(71) Applicant: PixArt Imaging Inc., Hsin-Chu City (TW)

(72) Inventors: Wan Piang Lim, Penang (MY); Sai Mun Lee, Penang (MY)

(73) Assignee: PixArt Imaging Inc., Hsin-Chu City (TW)

( * ) Notice: Subject to any disclaimer, the term of this patent is extended or adjusted under 35 U.S.C. 154(b) by 98 days.

(21) Appl. No.: 18/592,392

(22) Filed: Feb. 29, 2024

(65) Prior Publication Data

US 2024/0206052 A1     Jun. 20, 2024

Related U.S. Application Data

(62) Division of application No. 17/701,642, filed on Mar. 22, 2022, now Pat. No. 11,956,892.

(51) Int. Cl.
| *H05K 1/02* | (2006.01) |
| *H05K 3/04* | (2006.01) |

(52) U.S. Cl.
CPC ........... *H05K 1/0274* (2013.01); *H05K 3/041* (2013.01); *H05K 2201/10121* (2013.01); *H05K 2201/10151* (2013.01)

(58) Field of Classification Search
CPC ................................................... H05K 1/0274
USPC ........................................................ 361/760
See application file for complete search history.

(56) References Cited

U.S. PATENT DOCUMENTS

| 6,421,045 | B1 | 7/2002 | Venkat | |
| 7,009,598 | B1 | 3/2006 | Bohn | |
| 2003/0057426 | A1* | 3/2003 | Miyazaki | ............... H04N 23/55 |
| | | | | 257/88 |
| 2009/0056111 | A1 | 3/2009 | Muren | |
| 2016/0268693 | A1* | 9/2016 | Ding | ..................... H01Q 1/526 |
| 2021/0318507 | A1 | 10/2021 | Oh | |

FOREIGN PATENT DOCUMENTS

| CN | 2645238 | Y | 9/2004 | |
| CN | 1694054 | A | 11/2005 | |
| CN | 2901733 | Y | 5/2007 | |
| CN | 205430768 | * | 8/2016 | |
| TW | 200822721 | | 5/2008 | |
| WO | WO-2022053512 | A1 * | 3/2022 | ............. F21V 13/08 |

* cited by examiner

*Primary Examiner* — Stanley Tso
(74) *Attorney, Agent, or Firm* — Winston Hsu

(57)     ABSTRACT

An optical package includes: a Printed Circuit Board (PCB) including a plurality of cut-out sections; a lens, including a first plurality of protrusions corresponding respectively to the plurality of cut-out sections, wherein the first plurality of protrusions includes three protrusions being guide posts, a first protrusion of the first plurality of protrusions is formed on a first side of the lens, and a second protrusion of the first plurality of protrusions is formed on a second side of the lens opposite to the first side, and when the lens is placed under the PCB, the first plurality of protrusions will pass through the cut-out sections; and a sensor for attaching on to the lens and the PCB.

9 Claims, 11 Drawing Sheets

Snap Features

230

260

240

230

220     Guide Posts

METHOD AND STRUCTURE FOR ALIGNMENT OF LENS TO OPTICAL PRODUCT AT PCBA LEVEL

CROSS REFERENCE TO RELATED APPLICATIONS

This application is a division of U.S. application Ser. No. 17/701,642, filed on Mar. 22, 2022. The content of the application is incorporated herein by reference.

BACKGROUND OF THE INVENTION

1. Field of the Invention

The invention is directed to optical sensor packages, and particularly, to a design and method which can locate, align and lock the position of a lens and sensor of an optical sensor package at a Printed Circuit Board Array (PCBA) level.

2. Description of the Prior Art

Optical sensor packages are formed of a sensor and an LED disposed on a printed circuit board (PCB), which is placed on a base plate comprising a lens. In order to fix all these components so that the entire package is stable, the lens is placed in a pocket of the base plate, and is further aligned with the optical sensor via a protrusion on the sensor corresponding to a pocket/depression on the lens. The PCB is pressed down onto the base plate, thus setting the height of the optical sensor package.

Refer to FIG. 1 which is a diagram of a prior art optical sensor package 100, illustrating the stages of forming the product as well as how the individual elements are fixed in place.

As shown in the bottom of the diagram, the base plate 110 has a pocket which aligns to the shape of the lens 120 for fixing it in place. The PCB 130 has a cut-out section which corresponds to the entire area of the lens 120, and allows the lens 120 to protrude through the PCB 130. A chip (sensor) 140 is placed onto the lens 120 via the cut-out section of the PCB 130, wherein the sensor 140 includes a protrusion (not illustrated) which corresponds to a depression/pocket on the lens 120, as illustrated by the circular hole. Finally, an LED 150 and LED clip 160 are placed onto the PCB 130 next to the sensor 140. The PCB 130 has a number of holes for affixing these components.

The structure illustrated in FIG. 1 has some stability issues. As described above, the lens 120 and the base plate 110 are aligned with each other, and the lens 120 is aligned with the sensor 140; however, the lens 120 is not aligned with the PCB 130. This means that the lens 120 may rotate in a horizontal direction, due to the size of the opening in the PCB 130.

It is therefore an objective of the present invention to provide a structure which improves the stability issues present in the related art.

SUMMARY OF THE INVENTION

This in mind, the invention provides a design and method for aligning a lens to an optical sensor package at a PCBA level.

An optical package according to a first exemplary embodiment comprises: a Printed Circuit Board (PCB) comprising a plurality of cut-out sections; a lens, comprising a first plurality of protrusions corresponding respectively to the plurality of cut-out sections, wherein the first plurality of protrusions comprises three protrusions being guide posts, a first protrusion of the first plurality of protrusions is formed on a first side of the lens, and a second protrusion of the first plurality of protrusions is formed on a second side of the lens opposite to the first side, and when the lens is placed under the PCB, the first plurality of protrusions will pass through the cut-out sections; and a sensor for attaching on to the lens and the PCB.

In one modification, the guide posts are heat staked to the PCB. In another modification, the guide posts are glued to the PCB using an epoxy. In another modification, the guide posts are guide posts with tight-fit ribs.

An optical package according to a second exemplary embodiment comprises: a Printed Circuit Board (PCB) comprising a plurality of cut-out sections; a lens, comprising a first plurality of protrusions corresponding respectively to the plurality of cut-out sections, wherein the first plurality of protrusions comprises three protrusions being snap features, a first protrusion of the first plurality of protrusions is formed on a first side of the lens, and a second protrusion of the first plurality of protrusions is formed on a second side of the lens opposite to the first side, and when the lens is placed under the PCB, the first plurality of protrusions will pass through the cut-out sections; and a sensor for attaching on to the lens and the PCB. The snap features comprise outward-facing protrusions which attach to the top of the PCB.

In the optical package, the lens further comprises a first feature and the sensor has a protrusion, wherein the first feature is designed to correspond to the protrusion for fixing the lens to the sensor. The first feature is cylindrical and corresponds to a shape of the lens.

A method for designing an optical package is also provided. The method according to an exemplary embodiment comprises: forming a lens comprising a first plurality of protrusions, wherein the first plurality of protrusions comprises three protrusions being guide posts, a first protrusion of the first plurality of protrusions is formed on a first side of the lens, and a second protrusion of the first plurality of protrusions is formed on a second side of the lens opposite to the first side; forming a Printed Circuit Board (PCB) comprising a plurality of cut-out sections corresponding respectively to the first plurality of protrusions; placing the lens under the PCB so that the first plurality of protrusions pass through the plurality of cut-out sections; and attaching a sensor on to the lens and the PCB.

In one modification, the method further comprises heat-staking the guide posts to the PCB. In another modification, the method further comprises gluing the guide posts to the PCB using an epoxy. In another modification, the guide posts are guide posts with tight-fit ribs.

In the method, the lens further comprises a first feature, the sensor comprises a protrusion, and the step of attaching the sensor on to the lens and the PCB comprises attaching the sensor on to the lens so that the protrusion corresponds to the first feature. The first feature is cylindrical and corresponds to a shape of the lens.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Figure 1:
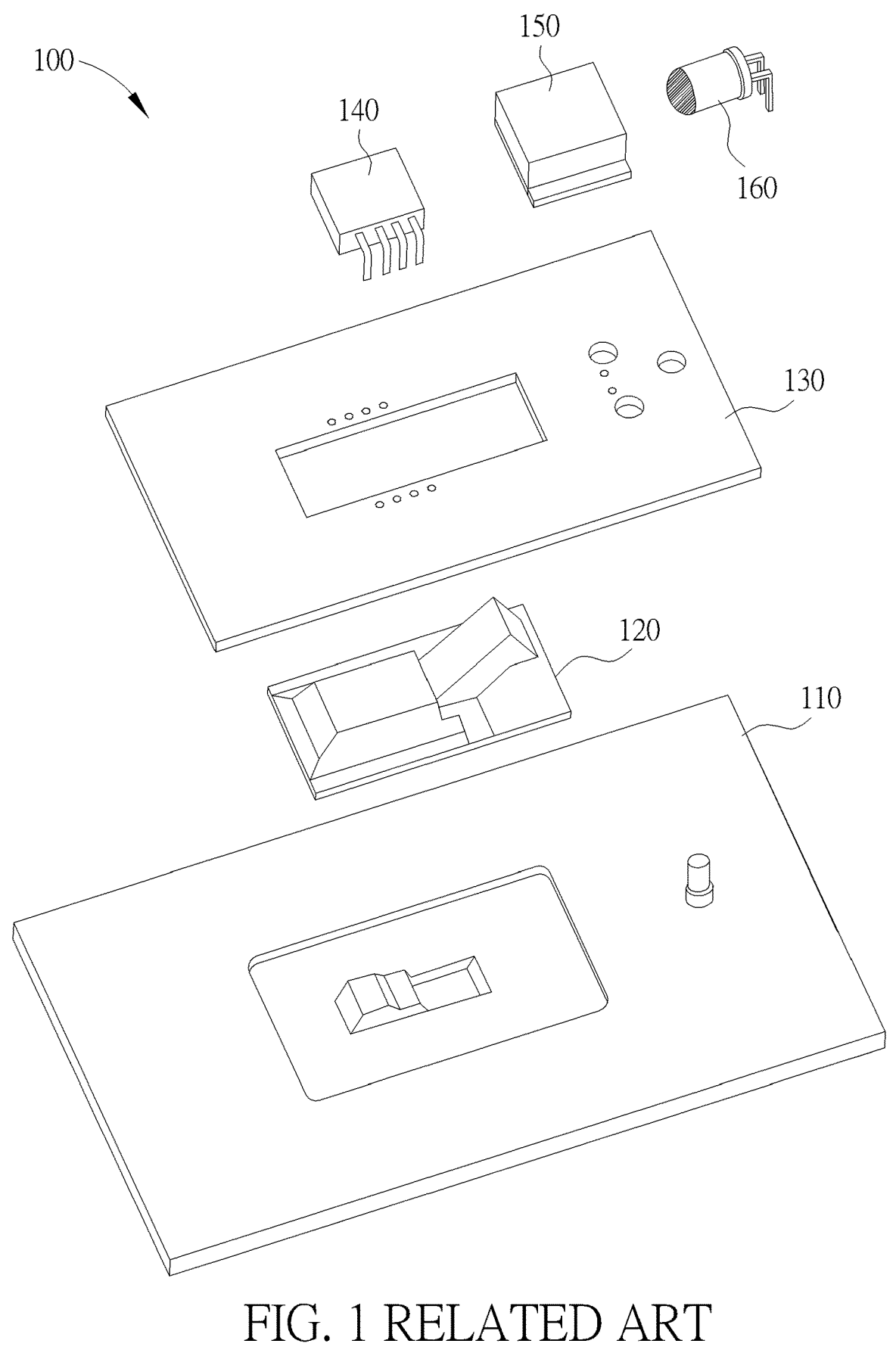

FIG. 1 is a diagram of an optical sensor package according to the related art.

DETAILED DESCRIPTION

The present invention provides a design for an optical sensor package at a PCBA level, wherein a lens can be aligned to both a PCB and to a sensor of the optical sensor package. This provides greater stability in both a vertical and horizontal direction.

Figure 2:
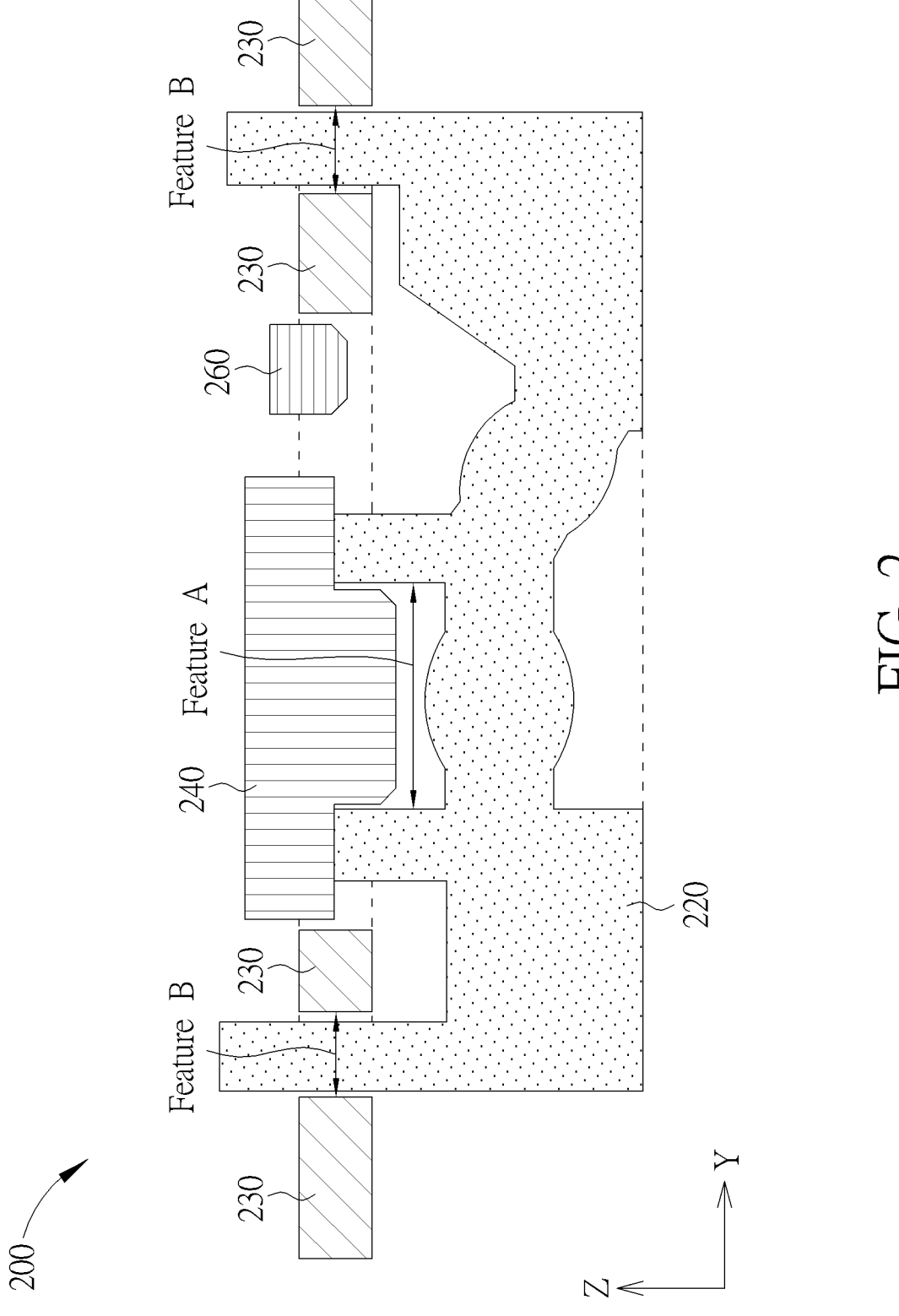
FIG. 2 is a cross-section of an optical sensor package according to an exemplary embodiment of the present invention.

Refer to FIG. 2, which is a side-on diagram of part of an optical sensor package 200 according to an embodiment of the present invention. Note that this diagram does not illustrate a base plate, but merely shows a PCB 230, lens 220, LED 260 and sensor package 240. Two specific features are highlighted in the diagram: Feature A and Feature B.

Feature A is for attaching the lens 220 to the sensor package 240, and comprises a cylindrical surface corresponding to the concentric surface of the lens 220. The fitting must be tight or have minimal clearance in order to ensure optimum optical performance. As the surface of Feature A is rounded, there is still the possibility of rotation of the lens 220 with respect to the sensor package 240.

Feature B is for locking the lens 220 into place with respect to the PCB 230, which can ensure stability in both a vertical direction and a horizontal (rotational) direction. Moreover, by enabling the lens 220 to be locked into place with respect to both the sensor 240 and the PCB 230, the lens 220, sensor 240 and PCB 230 form a stable component that can then be fixed onto the base plate (not illustrated) as a single piece, which makes assembly easier.

Figure 3:
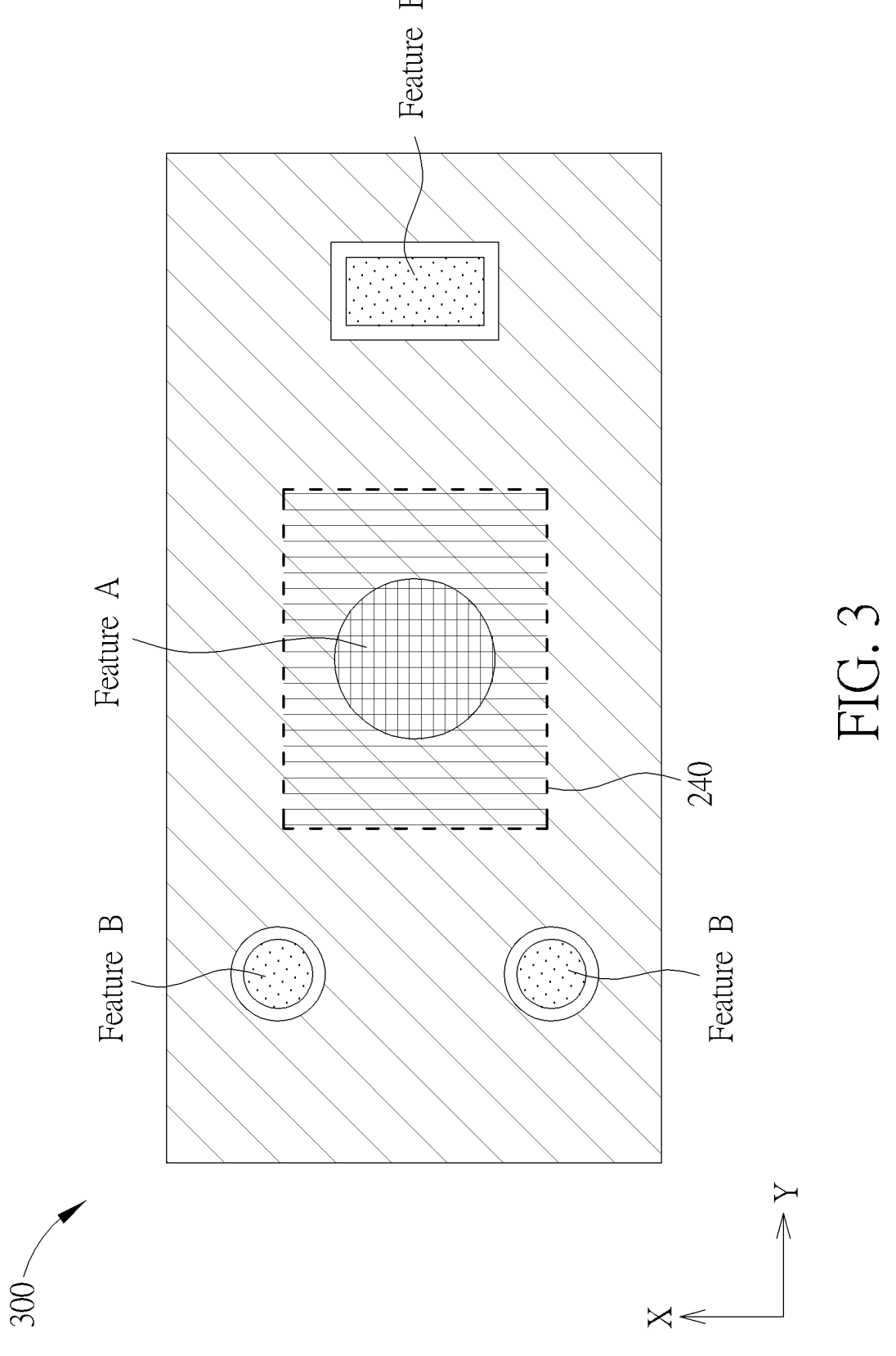
FIG. 3 is a top-view diagram of an optical sensor package according to an exemplary embodiment of the present invention.

Refer to FIG. 3 which is a top-view diagram of an optical sensor package 300 according to an exemplary embodiment of the present invention. As shown in the diagram, Feature B comprises three separate features. Further, in this embodiment, the two features on the left-hand side of the PCB 230 have a different shape from the single feature on the right-hand side of the PCB 230. It should be noted that the invention is not limited to the number and shape of Feature B as shown in FIG. 3. In practice, Feature B may comprise a single feature, two features, three features etc. The number of features is only limited by the size of the PCB, as there will be a tradeoff between stability and area. Further, no matter how many features comprises Feature B, they may all have the same shape, they may all have different shapes or they may have the distribution as shown in FIG. 3. In a preferred embodiment, Feature B comprises at least two features placed on either side of the sensor 240, so that the optical sensor package can be locked in the horizontal (rotational) direction. The choice of shapes and numbers will depend on practical requirements such as cost, stability and ease of manufacturing.

The following diagrams illustrate different embodiments of Feature B. For ease of illustration, in each embodiment illustrated herein, Feature B comprises three individual features which are all the same shape.

Figure 4A:
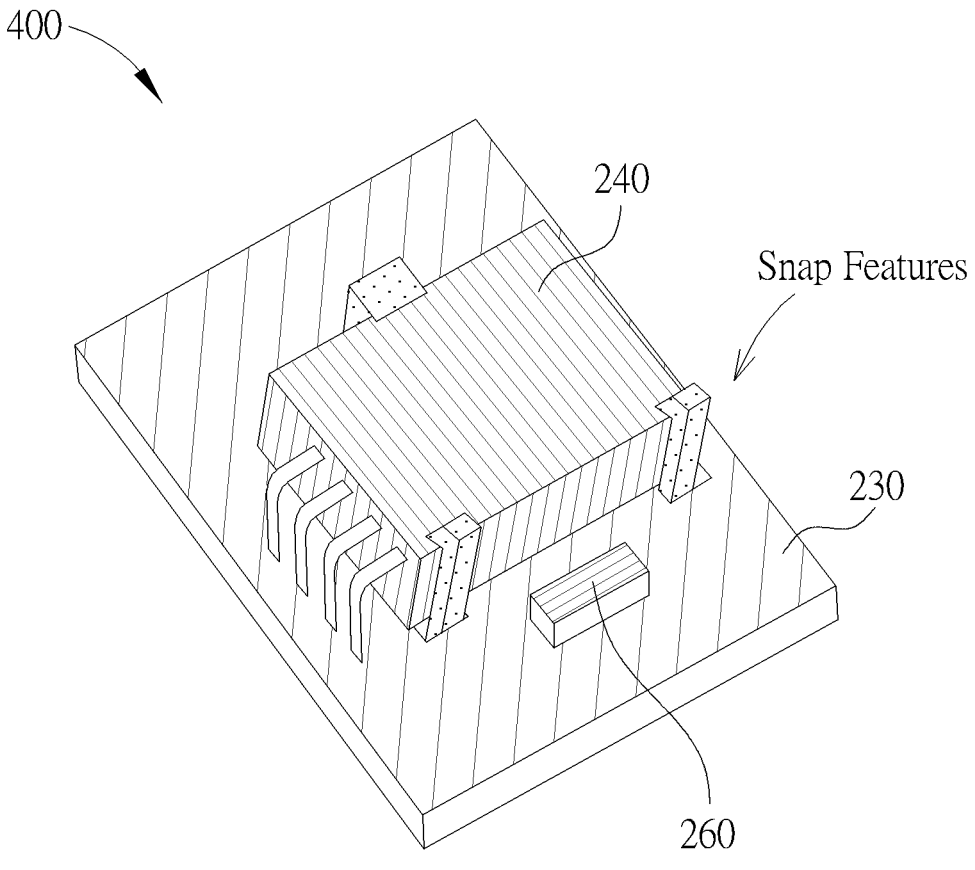
FIG. 4A is an assembly view diagram of a lens, sensor and PCB according to a first embodiment of the present invention.
Figure 4B:
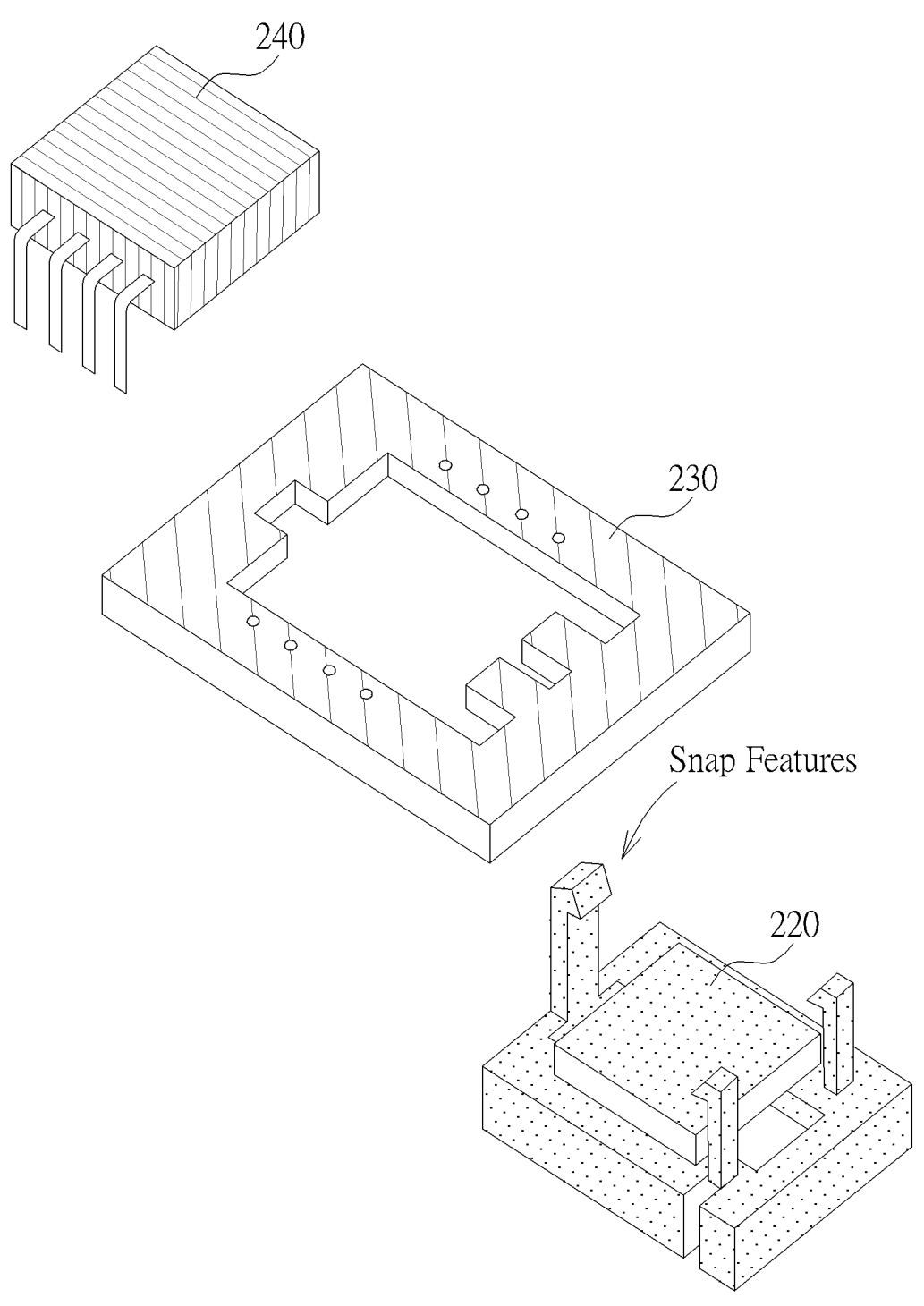
FIG. 4B is an exploded view of the lens, sensor and PCB shown in FIG. 4A.

Refer to FIG. 4A and FIG. 4B. FIG. 4A is an assembly view of a lens 220, sensor 240 and PCB 230 according to a first embodiment of the invention. For ease of description, the lens 220, sensor 240 and PCB 230 will herein be referred to as a sensor package 400. FIG. 4B is an exploded view of the sensor package 400 shown in FIG. 4A. In this embodiment, Feature B consists of three snap features. The snap features will snap onto the sensor package 400, thereby locking the lens 220 to the sensor 240 in the Z-direction. As shown in FIG. 4B, the PCB 230 has cut-out sections which are for guiding the snap features.

In this embodiment, the snap features have protrusions facing inwards for locking onto the sensor 240. The snap features therefore need to be tall enough to clear the sensor 240 and lock onto the top of the sensor 240.

Figure 5A:
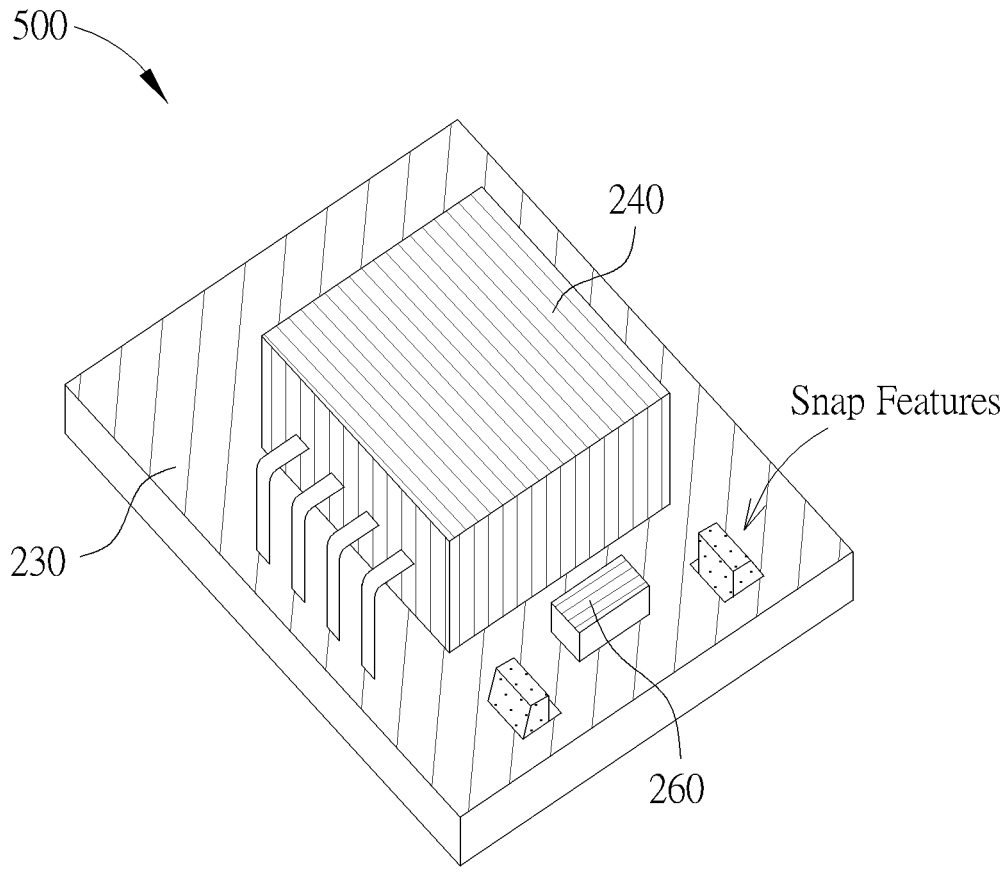
FIG. 5A is an assembly view diagram of a lens, sensor and PCB according to a second embodiment of the present invention.
Figure 5B:
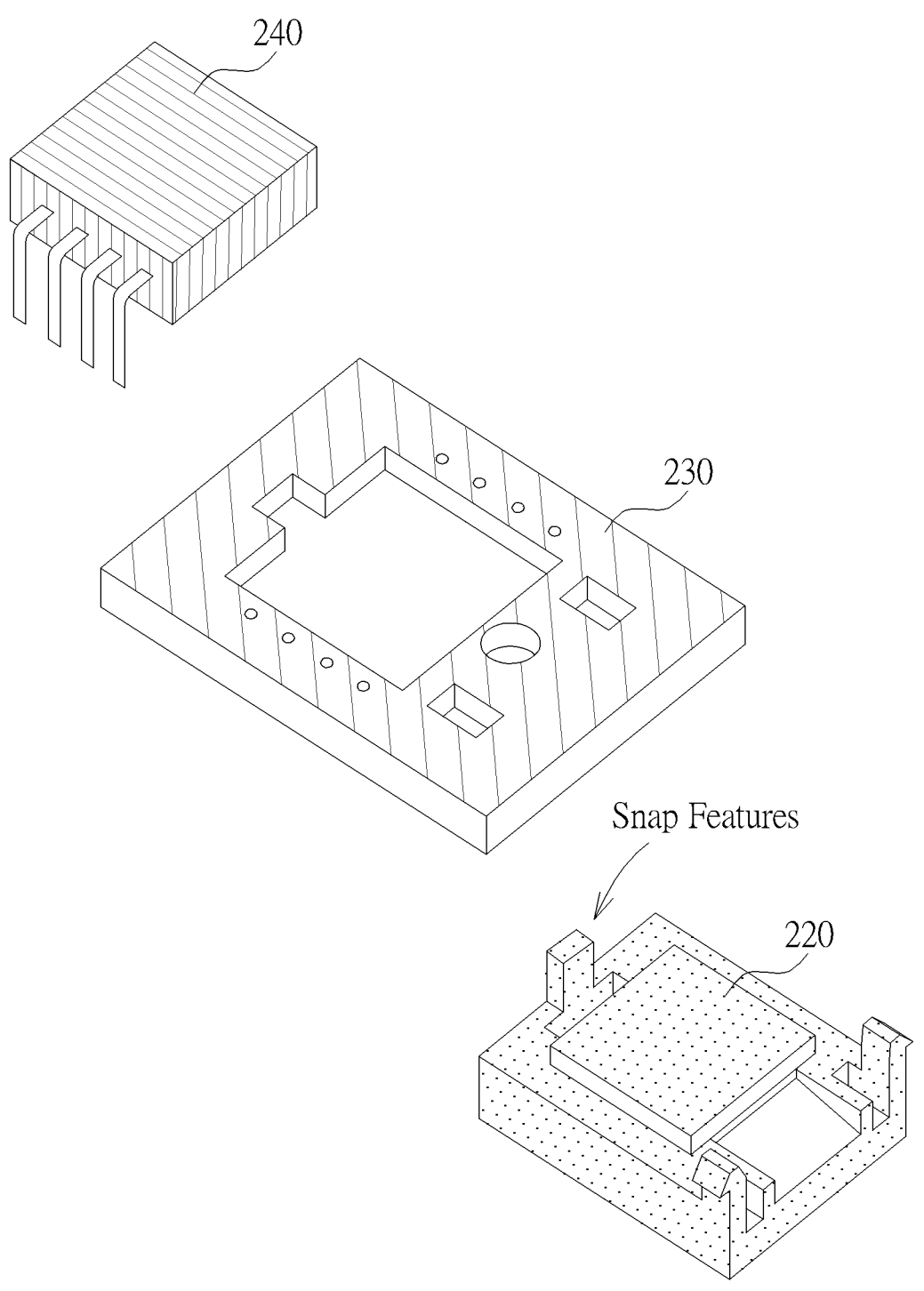
FIG. 5B is an exploded view of the lens, sensor and PCB shown in FIG. 5A.

A sensor package 500 according to a second embodiment of the invention is shown in FIG. 5A and FIG. 5B. In this embodiment, Feature B comprises snap features but they are for locking onto the PCB 230 rather than onto the sensor 240. The snap features/protrusions of Feature B face outwards, so they do not interfere with the sensor 240. By locking onto the PCB 230 rather than the sensor 240, the snap features can be shorter than in the first embodiment 400. This provides a more rigid structure. Due to Feature A, the position of the lens 220 with respect to the sensor 240 is stable.

Figure 6A:
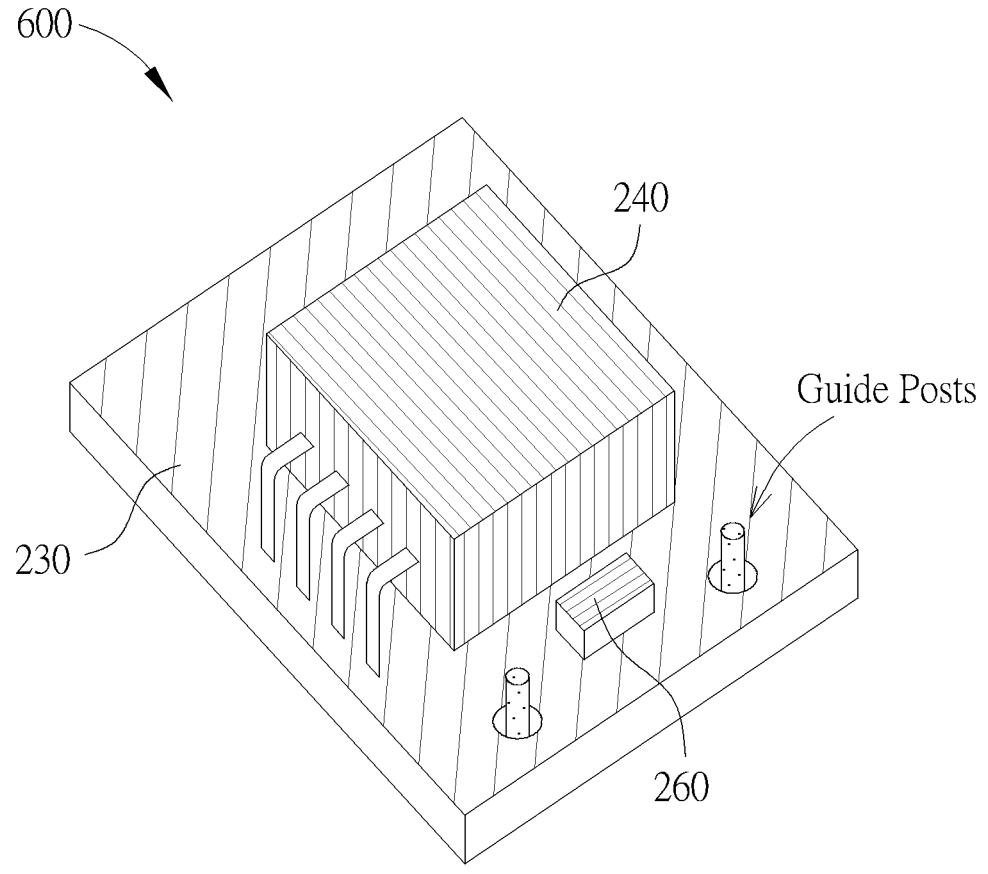
FIG. 6A is an assembly view diagram of a lens, sensor and PCB according to a third embodiment of the present invention.
Figure 6B:
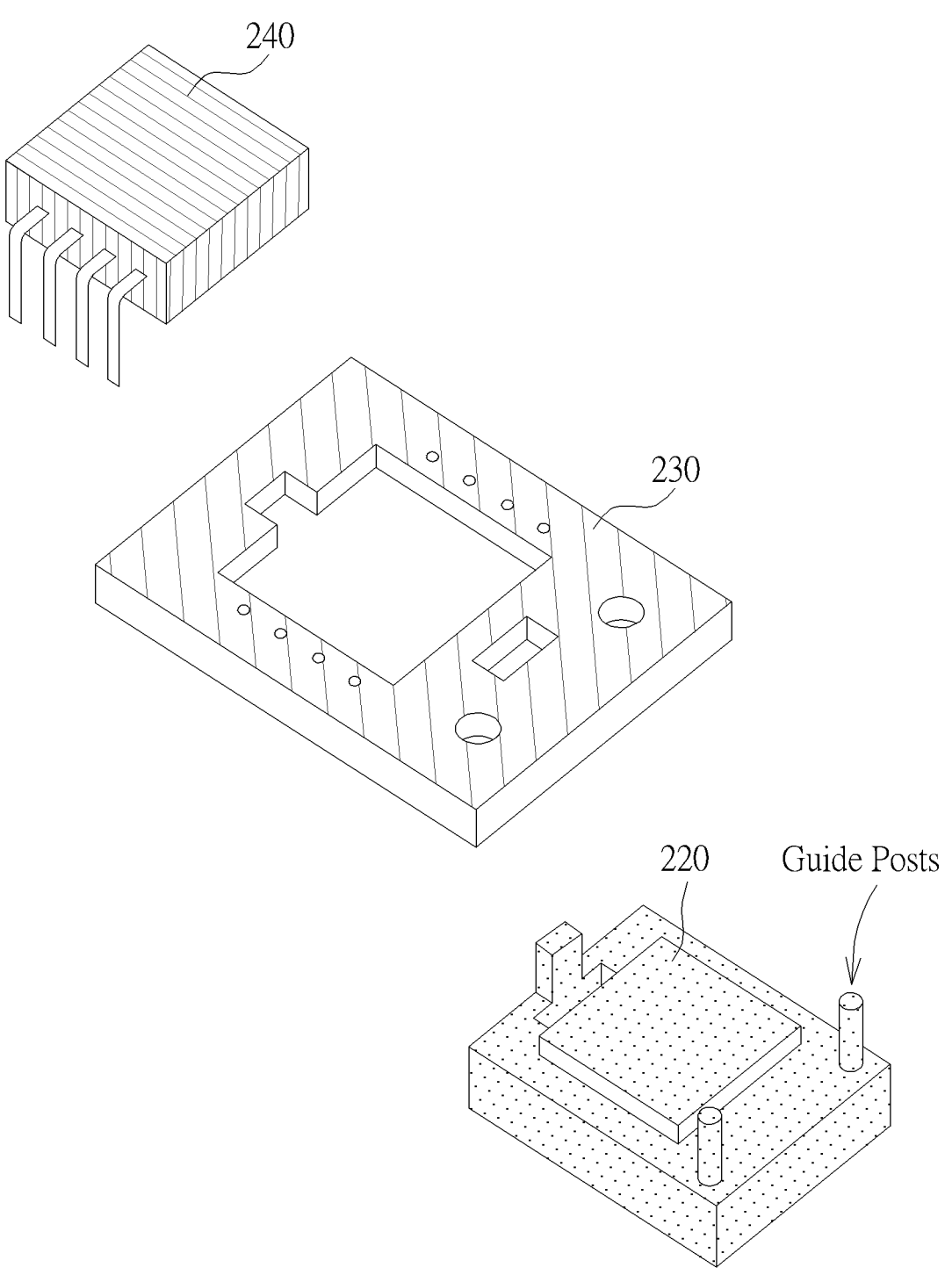
FIG. 6B is an exploded view of the lens, sensor and PCB shown in FIG. 6A.

A sensor package 600 according to a third embodiment of the invention uses guide posts, as illustrated in FIG. 6A and FIG. 6B. Rather than snapping onto the PCB 230 or sensor 240, the guide posts are glued or heat staked to the PCB 230. A disadvantage of gluing the guide posts is that excess glue/epoxy may be left on the PCB 230, as the epoxy can be messy and hard to control. Heat stake posts do not have this issue, but they do require an extra step in the assembly process for heating the posts to fix them to the PCB 230.

Figure 7A:
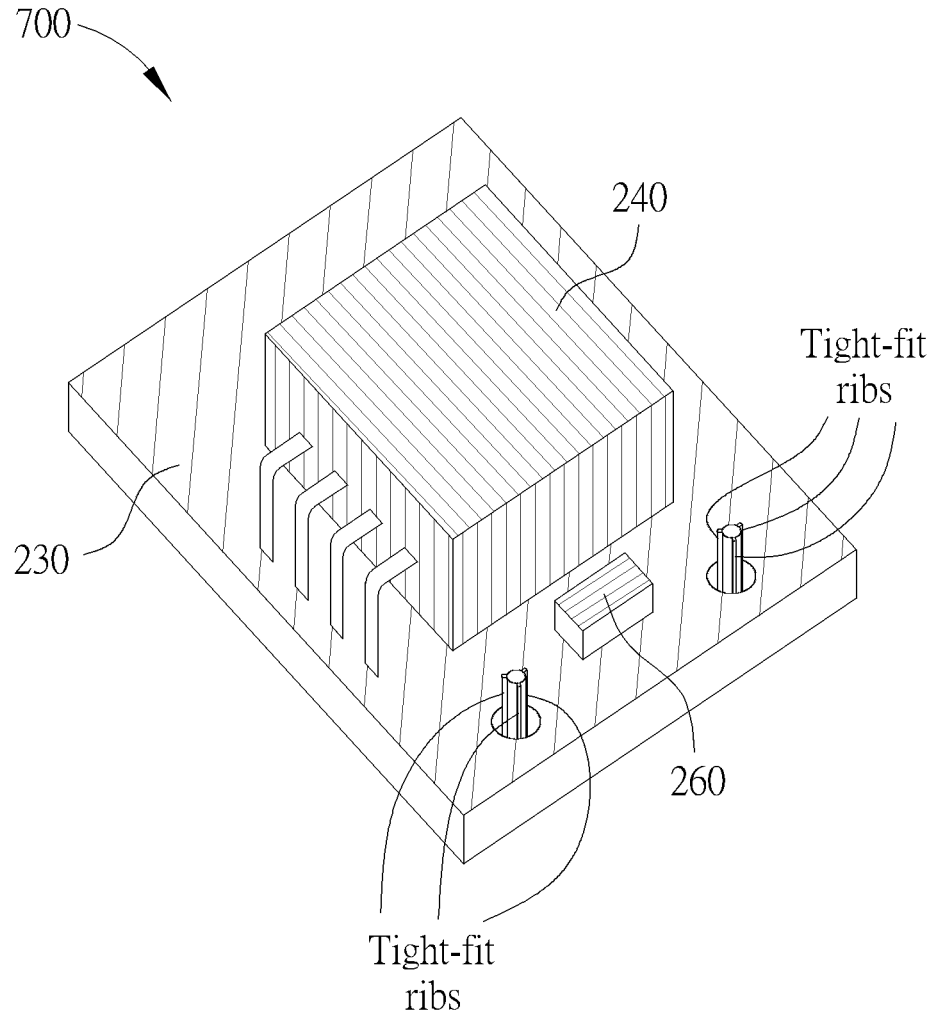
FIG. 7A is an assembly view diagram of a lens, sensor and PCB according to a fourth embodiment of the present invention.
Figure 7B:
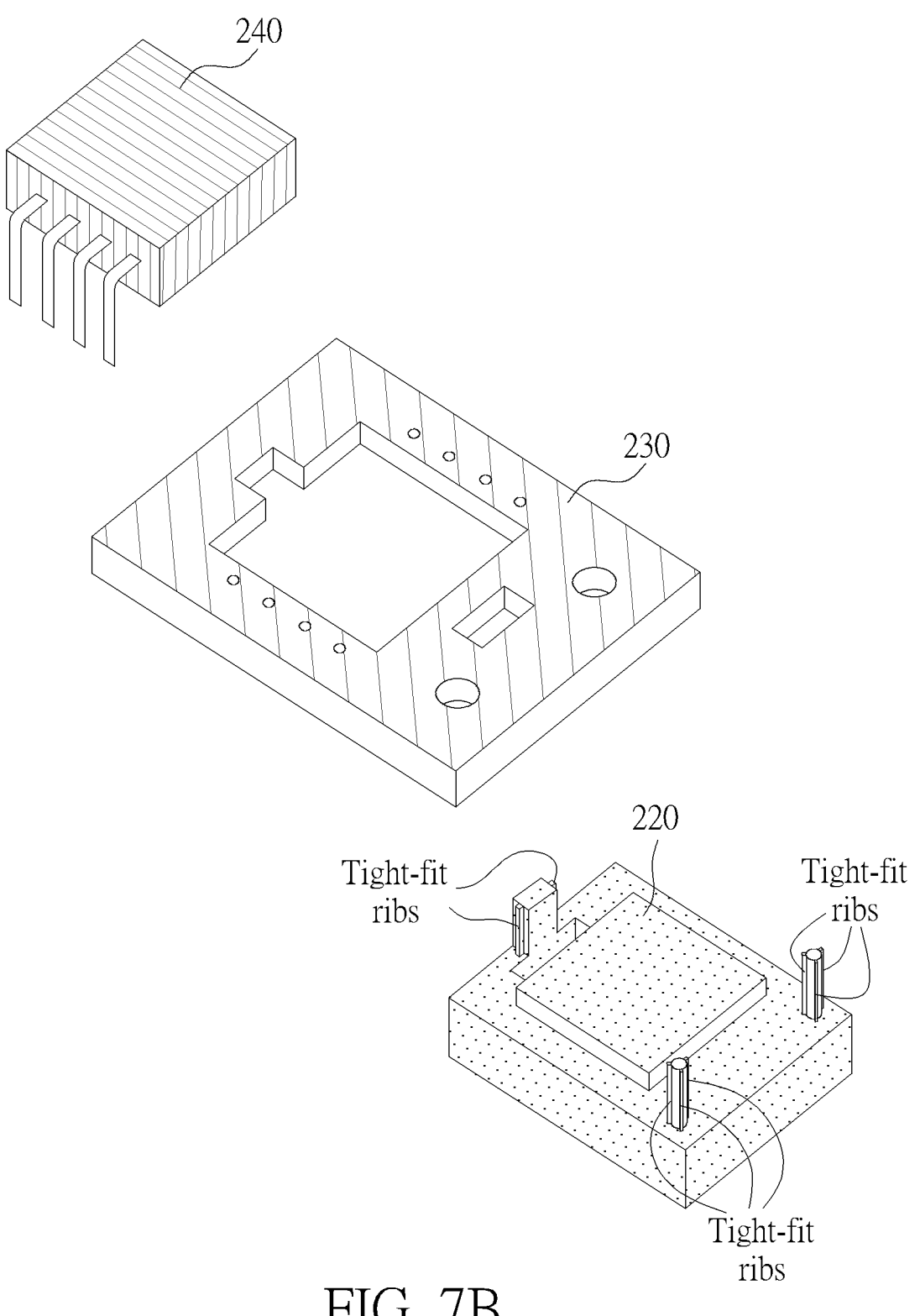
FIG. 7B is an exploded view of the lens, sensor and PCB shown in FIG. 7A.

A sensor package 700 according to a fourth embodiment of the invention uses guide posts with ribs, as shown in FIG. 7A and FIG. 7B. As in FIG. 6A, the guide posts pass through the cut-out sections of the PCB 230. In contrast with the embodiment shown in FIG. 6A and FIG. 6B, however, the ribs on the guide posts (illustrated by the darker features) allow the guide posts to lock the PCB 230 to the lens 220 without requiring gluing or heat-staking.

By designing a lens to include features allowing it to be aligned to a PCB as well as to a sensor, the lens not only can be fixed into a stable position with respect to the height of the structure (Z position), but also ensure that the lens will not rotate in the horizontal direction.

The lens can be designed in one piece, including the Feature A and Features B. The PCB should be designed to follow the design of the lens, as cut-out sections in the PCB are needed for guiding and locating Features B. When Feature B comprises guide posts, the assembly will require an extra step for heat-staking the guide posts to the PCB.

By locking all components of the optical sensor package in all directions (x, y, z), the overall system tolerance is reduced, and a robust package can be created which can improve optical tracking.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical package, comprising:
   a Printed Circuit Board (PCB) comprising a plurality of cut-out sections;
   a lens, comprising a first plurality of protrusions corresponding respectively to the plurality of cut-out sections, wherein the first plurality of protrusions comprises three protrusions being guide posts with ribs, a first protrusion of the first plurality of protrusions is formed on a right hand side of the lens, and a second protrusion of the first plurality of protrusions is formed on a left hand side of the lens opposite to the right hand side, and when the lens is placed under the PCB, the first plurality of protrusions will pass through the cut-out sections for attaching the lens to the PCB; and
   a sensor for attaching on to the lens and the PCB;
   wherein the lens is only attached to the PCB via the guide posts, and the ribs enable the guide posts to tightly attach to the cut-out sections of the PCB.

2. The optical package of claim 1, wherein the guide posts are heat staked to the PCB.

3. The optical package of claim 1, wherein the guide posts are glued to the PCB.

4. The optical package of claim 3, wherein the guide posts are glued to the PCB using an epoxy.

5. The optical package of claim 1, wherein the lens further comprises a first feature and the sensor has a protrusion, wherein the first feature is designed to correspond to the protrusion for fixing the lens to the sensor.

6. The optical package of claim 5, wherein the first feature is cylindrical and corresponds to a shape of the lens.

7. An optical package, comprising:
   a Printed Circuit Board (PCB) comprising a plurality of cut-out sections;
   a lens, comprising a first plurality of protrusions corresponding respectively to the plurality of cut-out sections, wherein the first plurality of protrusions comprises three protrusions being snap features, a first protrusion of the first plurality of protrusions is formed on a first side of the lens, and a second protrusion of the first plurality of protrusions is formed on a second side of the lens opposite to the first side, and when the lens is placed under the PCB, the first plurality of protrusions will pass through the cut-out sections; and
   a sensor for attaching on to the lens and the PCB;
   wherein the snap features comprise outward-facing protrusions which attach to the top of the PCB and the lens is only attached to the PCB via the snap features.

8. The optical package of claim 7, wherein the lens further comprises a first feature and the sensor has a protrusion, wherein the first feature is designed to correspond to the protrusion for fixing the lens to the sensor.

9. The optical package of claim 8, wherein the first feature is cylindrical and corresponds to a shape of the lens.

\* \* \* \* \*